United States Patent [19]

Mori

[11] 4,447,718

[45] * May 8, 1984

[54] APPARATUS FOR COLLECTING AND CONCENTRATING SOLAR LIGHT ENERGY

[76] Inventor: Kei Mori, 3-16-3-501, Kaminoge, Setagaya-ku, Tokyo, Japan

[*] Notice: The portion of the term of this patent subsequent to Jul. 20, 1999 has been disclaimed.

[21] Appl. No.: 278,202

[22] Filed: Jun. 29, 1981

[30] Foreign Application Priority Data

Jul. 7, 1980 [JP] Japan .................................. 55-92468
May 6, 1981 [JP] Japan .................................. 56-66942

[51] Int. Cl.³ ................................................ G01J 1/20
[52] U.S. Cl. .................................. 250/203 R; 126/425
[58] Field of Search .................... 250/203 R, 209, 216, 250/227; 126/425, 424; 350/258, 262, 264

[56] References Cited

U.S. PATENT DOCUMENTS

| 4,223,214 | 9/1980 | Dorian et al. | 250/203 R |
| 4,225,781 | 9/1980 | Hammons | 126/425 |
| 4,340,812 | 7/1982 | Mori | 350/258 |

*Primary Examiner*—David C. Nelms
*Attorney, Agent, or Firm*—Merchant, Gould, Smith, Edell, Welter & Schmidt

[57] ABSTRACT

An apparatus for collecting and concentrating solar light energy comprising; a transparent container; movable lens means in the container, for collecting solar light energy; optical fiber means located at the focus of the lens means and extending to the outside of the container; first and second drive means for rotating the lens means about vertical and horizontal axes; solar cell means connected to the first and second drive means to drive the same; and, means supported by the lens means, for detecting the position of the sun, said detecting means being connected to the drive means to drive the latter in accordance with the position of the sun.

15 Claims, 7 Drawing Figures

APPARATUS FOR COLLECTING AND CONCENTRATING SOLAR LIGHT ENERGY

The present invention relates to an apparatus for concentrating and collecting solar light energy for many uses, and in particular to a solar light energy collecting apparatus including lens means which are moved to automatically and successively follow the seasonal, daily and hourly changes in the location and angle of the sun, by means of drives such as motors which can be driven with a small drive force (torque) by means of an electrical energy fed from, for example, a solar cell, while preventing the lens means from being accidentally displaced or moved by wind pressure or by waves.

The application of the present invenition is directed, for example, to growing plants, or planktons, which are food for fish or other living things in the sea.

Various kinds of plants or fish and shellfish are growing or living in the sea.

The area of the ocean floor amounts to several times that of dry land. Morevoer, the soil of the ocean floor is fertile.

At present, a study for utilizing the ocean floor as a farming area is being carried out. However, the depth of the ocean floor farm which is being planned now is about from 8 to 13 meters from the surfce of the ocean, for example, at a coastal area. This depth is considered to be the maximum depth to obtain the solar light energy necessary for raising plats and it would be impossible to grow most plants in a place which is deeper than the above depth. In this connection, the strength of the total amount of sunbeams penetrating the sea is decreased about 50% for every one meter in depth. Consequently, the amount of sunbeams in a place 8 to 13 meters from the surface of the sea, would be decreased from $2^{-8}$ to $2^{-13}$, and would be further decreased in accordance with the degree of muddiness of the sea. Finally, it would be impossible to sufficiently raise plants in the sea sufficiently due to lack of light.

A collecting apparatus of the present invention can be advantageously used to provide solar light to areas deep in the sea.

There is known a solar light energy collecting apparatus which can follow or track the sun to effectively collect solar light energy. However, since this sun follower apparatus is electrically driven by a motor, to which the electric energy is fed from a commercial power supply, it is impossible, or next to impossible, to operate such a collecting apparatus which floats on the sea where no power supply is available. Alternatively, it is also possible to use a storage battery instead of the commercial power supply. However, in a case where the storage battery is used, maintenance of battery charging or exchanging is necessary.

The object of the present invention is, therefore, to provide a solar light energy collecting apparatus, including a sun follower, which can be mainly driven with a small drive torque by means of the electrical energy fed from a solar cell or the like and which is prevented from being accidentally displaced by the wind or waves when the apparatus is floating on the sea.

The present invention may be more fully understood from the description of the preferred embodiments of the invention presented below, together with the accompanying drawings, in which.

Figure 1:
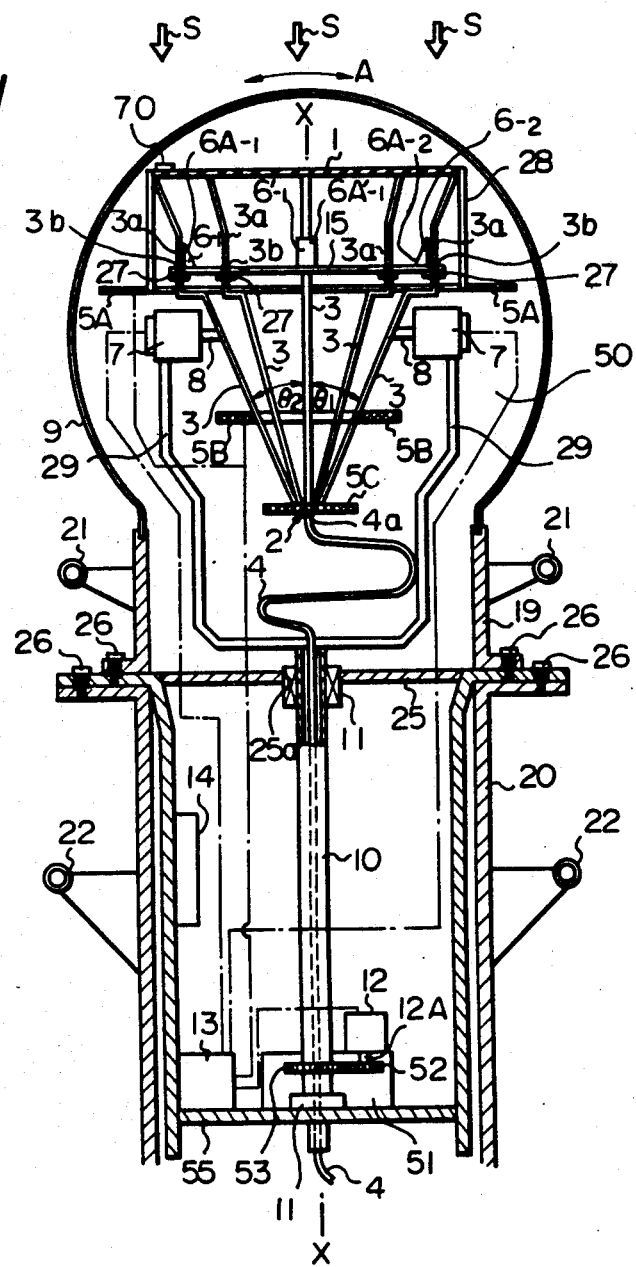
FIG. 1 is a longitudinal sectional view of an embodiment of a collecting apparatus according to the present invention.

In a generally spherical transparent capsule or container 9 is arranged an optical lens means which comprises a Fresnel lens 1 supported by inclined supporting frames 3 which have vertical legs 3a. The supporting frames 3 are connected to the outer periphery of the Fresnel lens 1 at an equi-angular distance and are converged to a sunbeam collecting portion 2 on which one end 4a of an optical fiber cable 4 is located. The supporting frames 8 generally form an imaginary cone. The focus of the Fresnel lens 1 is also located at the inlet end 4a of the cable 4, so that the sunbeams collected by the Fresnel lens 1 are concentrated in the cable 4. The Fresnel lens 1 concentrates or collects the sunbeams to the focus thereof, i.e. the end 4a of the fiber cable 4. The fiber cable 4 extends, for example, to the sea bottom. Below the Fresnel lens 1 is provided a generally annular ring frame 15 which is connected to the vertical legs 3a of the supporting frames 3. The vertical legs 3a have threaded portions 3b on which nuts 27 are screwengaged to support the ring frame 15 on the nuts 27. The ring frame 15 has generally C shaped rings 16 corresponding to the vertical legs 3a. The C rings 16 enable the frames 3 to be inserted therein from above, when the ring frame 15 is located on the nuts 27.

On the ring frame 15 are supported two pairs of sunbean detectors 6-1, 6-2 and 6'-1, 6'-2 which are located at an equiangular distance of 90° and which will be discussed in detail hereinafter.

The frames 3 which are diametrically arranged are connected to horizontal drive shafts 8 of first motors 7 which are supported by a generally U-shaped arm 29, so that the assembly (the ring frame 15, the frames 3, the Fresnel lens 1) can rotate about a horizontal axis extending between the two shafts 8 when the motors 7 and, accordingly, the shafts 8, rotate. The motors 7 are driven by solar cells 5A, 5B and 5C. In the illustrated embodiments, three solar cells are advantageously provided, but the number of the solar cells is not limited to three and may be one, two or more than three. The solar cell 5A, which may be of a ring-shape, is secured to a cylindrical support 28 which is connected and surrounds the Fresnel lens 1. The solar cells 5B and 5C, which may be of a ring-shape and of a disc-shape, respectivley, are connected to and supported by the frames 3. The solar cells are all located out of the imaginary core formed by the frames 3, so that the cells are not directly exposed to the sunbeams collected by the Fresnel lens 1. The sunbeams collected by the Fresnel lens 1 run along and are located within the imaginary cone.

The spherical capsule 9 is supported by a cylindrical support 19. Since, in the illustrated embodiment, the apparatus is intended to be floated on the sea, the cylindrical support 19 is rigidly connected to a cylindrical buoy 20 by means of bolts 26. Between the cylindrical support 19 and the buoy 20 is arranged an upper disc plate 25 which has a center hole 25a in which a vertical and hollow rotating shaft 10 is rotatably suported by means of a bearing 11. The upper disc plate 25 provides a sealed chamber 50 in the capsule 9. The rotating shaft 10 is rigidly connected to the arm 29 so that the arm 29 can rotate together with the shaft 10. The cable 4 extends through the shaft 10. The shaft 10 has a gear 53 which is rigidly connected thereto and which is engaged by a drive gear 52 in a gear box 51. The gear 52 is connected to a vertical drive shaft 12A of a second motor 12 located on the gear box 51 to transmit the rotation of the second motor 12 to the rotating shaft 10. The gear box 51 is supported on a lower disc plate 55 connected to the buoy 20. The numeral 11 designates a bearing for rotatably supporting the shaft 10.

On the lower disc plate 55 is located a storage battery 13 to which the solar cells 5A, 5B and 5C are electrically connected. The battery 13 is also electrically connected to the motors 7 and 12. Alternatively, the solar cells can be directly connected to the motors 7 and 12 to drive the motors. However, it is desirable to provide a storage battery 13 which stores the electrical energy from the solar cells and which can drive the motors even when the sunshine is not sufficiently strong enough to directly drive the motors.

The detectors 6-1, 6-2 and 6'-1, 6'-2, such as photosensors located on the annular frame 15, have inclined sunbeam receiving surfaces 6A-1, 6A-2 and 6A'-1, 6A'-2, respectively. The inclined surfaces 6A-1, 6A-2 and 6A'-1, 6A'-2 are substantially flush with a generatrix of the imaginary cone defined by the sunbeams collected by the Fresnel lens 1, so that when the Fresnel lens 1 is directed to and exactly opposed to the sun, the inclined surfaces of the detectors 6-1, 6-2 and 6'-1, 6'-2 do not receive the sunbeams designated by arrows S. The detectors 6-1, 6-2 and 6'-1, 6'-2 issue detecting signals only when the respective inclined surfaces receive sunbeams, i.e. only when the Fresnel lens 1 is deviated from the position of the sun.

Figure 7:
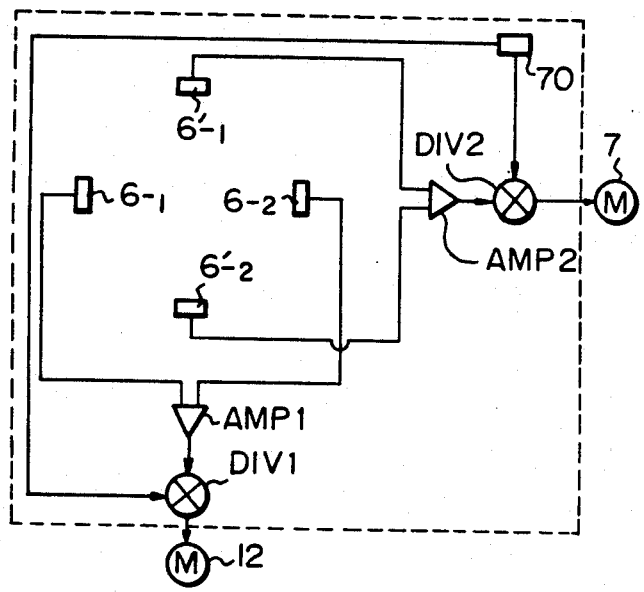
FIG. 7 is a schematic view of one exmaple of a circuit of a controller arranged in the apparatus of the present invention.

The detectors are electrically connected to a controller 14. The controller 14 controls the operation of the motors 7 and 12 in accordance with the detecting signals from the respective detectors 6-1, 6-2 and 6'-1, 6'-2. When the center axis X—X of the apparatus is parallel to sunbeams S, direct sunbeams do not arrive at the inclined surfaces 6a nor 6a' of the sunbeam detectors, and outputs of these sunbeam detectors respond only to indirect spacious rays. On the other hand, when the apparatus is inclined at an angle $\theta_1$ to the incident direction, direct sunbeams arrive only at the beam detector 6-2. When the sunbeams are inclined at an angle $\theta_2$ to the center axis X—X of the apparatus, direct sunbeams are not incident on the beam detector 6-2, but are incident only on the beam detector 6-1. The outputs of the beam detectors 6-1, 6-2 are compared with each other by a first difference amplifier AMP1 in the controller 14 and the motor 12 is driven to rotate the lens 1 about the axis X—X so that the difference between the two outputs becomes zero, as shown in FIG. 7. Similarly, when there is a difference between the output of the detectors 6'-1 and 6'-2, the outputs are compared with each other in a second difference amplifier AMP2, so that the motors 7 are driven to rotate the Fresnel lens 1 about the shafts 8 until the difference becomes zero. Thus, the apparatus can be always directed to the sun, that is, the optical axis X—X of the apparatus is parallel to the sunbeams. The axes of the shafts 8 and the shaft 10 intersect with each other generally at the center of the spherical capsule 9. The elements arranged in the capsule 9 are all balanced with respect to the center of the spherical capsule 9, so that no eccentric load is applied to the horizontal shafts 8 and the vertical shaft 10, thus resulting in a decrease of the drive power of the motors 7 and 12.

Preferably an additional sunbeam detector 70 (FIG. 1) is provided on the upper surface of the Fresnel lens 1, so that the detector 70 almost always receives the sunbeams from sunset till sunrise. The additional detector 70 is adapted to ensure the tracking movement of the apparatus, even when the sumbeams are weak, particularly at about sunset or on a cloudy day. When the sunbeams are weak, the difference between the outputs of the detectors 6-1 and 6-2 or 6'-1 and 6'-2 becomes small, which may cause the apparatus to fail to follow the sun. On the other hand, if the apparatus is designed in such a way that it follows the sun, even when the controller 14 detects a very small difference between the output of the pairs of detectors 6-1, 6-2 and 6'-1, 6'-2, the displacement of the apparatus for tracking the sun tends to become too large under strong sunbeams during daytime.

In order to solve this problem, the difference of the outputs between the detectors 6-1 and 6-2 or 6'-1 and 6'-2 can be divided by the output of the additional detector 70 by means of dividers DIV1 or DIV2 (FIG. 7). That is, supposing that $L_1$, $L_2$ and $L_0$ designate the output of the detectors 6-1 (or 6'-1), 6-2 (or 6'-2) and 70, respectively, the DIV1 or DIV2 operates;

$$(L_1 - L_2/L_0)$$

Although, the difference $(L_1 - L_2)$ of the outputs between the detectors 6-1 and 6-2 (6'-1 and 6'-2), during the daytime is larger than that at about sunset, the output $(L_0)$ of the additional detector 70 during the daytime is also larger than that at about sunset. Therefore, there is no large difference of the ratio $(L_1 - L_2)/L_0$ between daytime and sunset. The output of the detector 70 can be considered a variable reference which varies in accordance with the strength or amount of the sunbeams, for the divisional operation by the dividers DIV1 and DIV2. The motors 7 (and/or 12) are driven when the ratio is larger than a predetermined valve $\epsilon$; $[(L_1 - L_2)/L_0 \geq \epsilon]$.

The capsule 9 protects all of the elements provided therein from the external influences, such as wind or rain, and from corrosive substances, such as salt water.

When the apparatus is floated on the sea (the sea level is designated by L in FIG. 3), the apparatus can be first hung by ropes 47 with the help of a hanger 23, for example, from a ship (not shown). The ropes 47 can be connected to eye members 21, 22 secured to the cylindrical support 19 and the buoy 20, respectively. The numeral 24 (FIG. 3) designates a warning lamp for indicating the presence of the apparatus on the sea.

Since the horizontal and vertical rotating shafts 8 and 10 intersect with each other at the center of the spherical capsule 9, the torque necessary for driving the motors 7 and 12 can be decreased.

Furthermore, since almost all the elements are arranged in the protecting capsule, they are protected from the window, which has a bad influence on the movement of the apparatus, as well as from dust or undesirable chemical substances which pollute or corrode the elements. The inside of the capsule is sealed, and the temperature in the capsule can be easily controlled to prevent moisture from condensing on the inner wall of the capsule.

Figure 2:
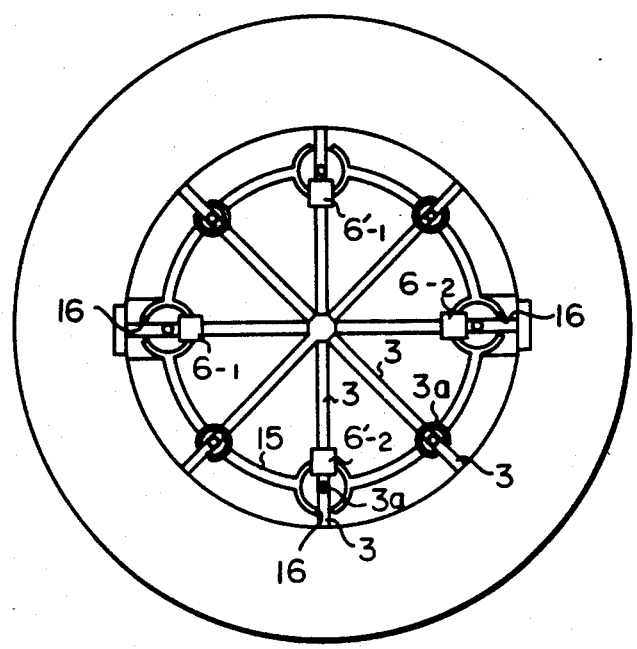
FIG. 2 is a plan view of sunbeam detectors and a support thereof shown in FIG. 1.
Figure 3:
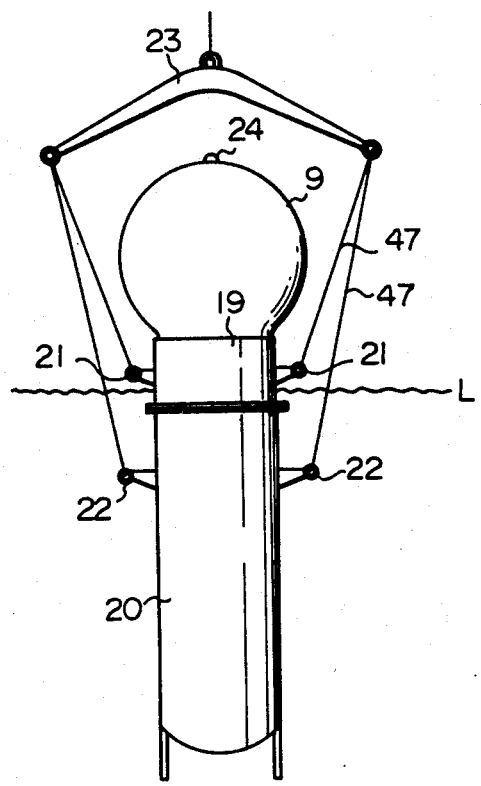
FIG. 3 is a side elevational view of the collecting apparatus of FIG. 1, shown in a hung position in which the apparatus is hung to assemble and disassemble the same.

In an embodiment illustrated in FIGS. 1-3, when the apparatus is floated on the sea, the apparatus may swing or oscillate under the influence of the waves. In particular, when the apparatus swings in the directions A (FIG. 1), a quick response to the swing movement cannot be expected, because the motor 12 first drives to rotate the Fresnel lens 1 about the shaft 10 and then the motors 7 drive to rotate the Fresnel lens 1 about the shafts 8.

Figure 4:
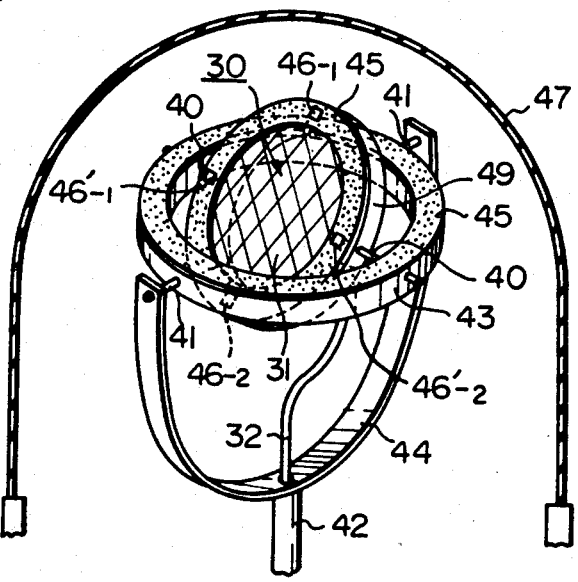
FIG. 4 is a perspective view of another embodiment of a collecting apparatus according to the present invention.
Figure 5:
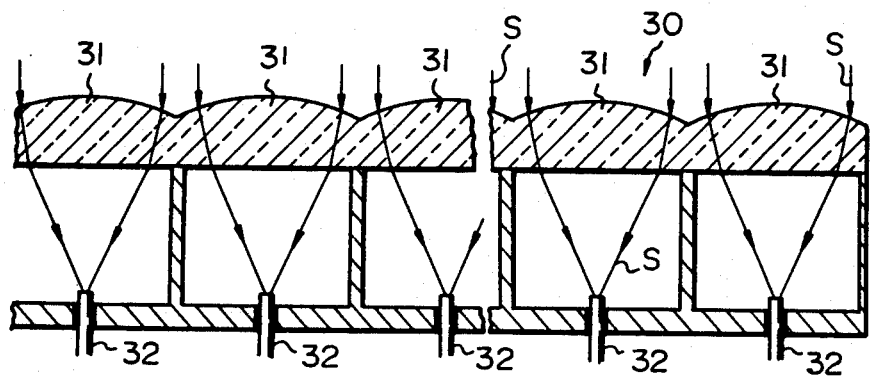
FIG. 5 is a sectional side view of lens means shown in FIG. 4.

In order to solve the problem of such a bad response, a gimbal ring mechanism can be provided, as shown in FIG. 4. In FIG. 4, there is provided a thin lens means 30 which, for example, comprises a plurality of small diameter lenses 31 having a short focal length (FIG. 5). The lens means 30 is supported by a first gimbal ring 49 which is rotatably supported by a second gimbal ring 43 by means of first horizontal rotating shafts 40. The second gimbal ring 43 is rotatably supported by a generally U-shaped gimbal arm 44 by means of second horizontal rotating shafts 41 which extend perpendicular to the first rotating shafts 40 in the same plane. The gimbal arm 44 is connected to a vertical rotating shaft 42 which corresponds to the vertical rotating shaft 10 in FIG. 1. Two pairs of sumbeam detectors 46-1, 46-2 and 46'-1, 46'-2 are located on the first gimbal ring 49 at an equiangular distance of 90°. The first horizontal shafts 40 and the vertical shaft 42 are driven by respective motors (not shown), corresponding to the motor 12 in FIG. 1, in such a way that the difference between the outputs of the detectors 46-1 and 46-2 becomes zero. The second horizontal shafts 41 are driven by a motor (not shown) corresponding to the motors 7 in FIG. 1, in such a way that the difference between the outputs of the detectors 46'-1 and 46'-2 is zero. In the embodiment illustrated in FIG. 4, the detectors may be small pieces of optical sensors. The numeral 47 designates a transparent capsule, corresponding to the spherical capsule 9 in FIG. 1, but consisting of a semispherical portion and a cylindrical portion.

Figure 6:
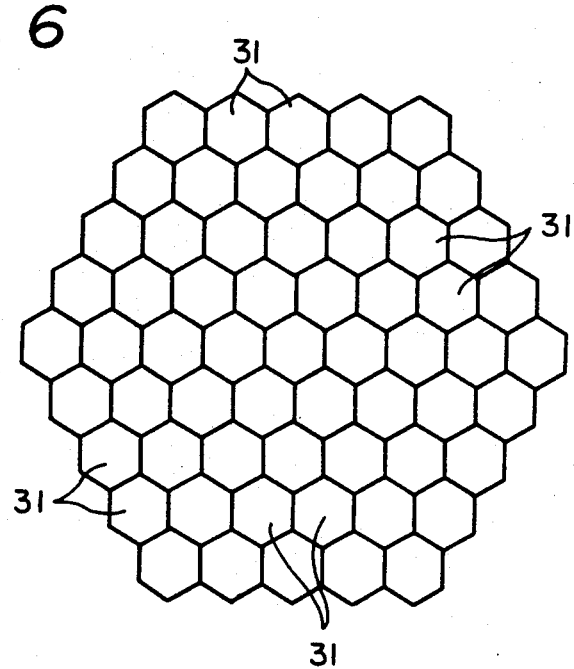
FIG. 6 is a plan view of FIG. 5 but shown in a reduced scale.

Optical fibers 32 are provided, one for each small lens 31, as shown in FIG. 5, and are located at the focuses of the corresponding lenses 31. In FIG. 4, only one optical fiber 32 is shown. The fibers 32 preferably extend together in the shaft 42. Since, the lens means 30 is composed of a plurality of small lenses 31, the focal length of the lens means can be decreased, in comparison with that of the lens means 1 in FIG. 1. For example, in FIG. 1, a single Fresnel lens on the market having a diameter of 35 cm can be used. The single Fresnel lens of 35 cm diameter can be replaced by sixty one small lenses 31 each having a diameter of 4 cm, in the same area as that of the single Fresnel lens. The largest number of the small lenses 31 can be obtained when the small lenses are regular hexagons in a honeycomb arrangement, as shown in FIG. 6. The lens means 30, consisting of the sixty one small lenses 31 of 4 cm diameter, has a focal length of about 4.5 cm, whereas the focal length of the lens means consisting of a single Fresnel lens of 35 cm diameter is approximately 39 cm.

In FIG. 4 a ring shape solar cell 45 can be provided on the first gimbal ring 49 and/or the second gimbal ring 43. Alternatively, it is also possible to replace some of the small lenses 31 by solar cells.

According to the embodiment illustrated in FIG. 4, the lens means can quickly follow the sun by moving in all directions and, accordingly, the apparatus can easily adjust to the direction of the lens means, even under the adverse influence of waves.

As can be understood from the above discussion, according to the present invention, there is provided an apparatus for collecting and concentrating solar light energy, which can easily follow the seasonal, daily and hourly "movement" of the sun and which can easily and quickly adjust to the direction of the lens means, which tends to fluctuate due to waves when the apparatus is floated on the sea.

I claim:

1. An apparatus for collecting and concentrating solar light energy comprising; a transparent container; lens means for collecting and concentrating solar light energy; first supporting means for supporting the lens means so as to rotate the lens means about a horizontal axis; second supporting means for supporting the first supporting means so as to rotate the latter about a vertical axis; optical fiber means located at the focus of the lens means and extending to the outside of the container to transmit the collected sunbeams to the outside of the container; first drive means for rotating the lens means about the vertical axis; second drive means for rotating the lens means about a horizontal axis, independently of the drive of the first drive means; solar cell means connected to the first and second drive means to drive the same; and, means movable with and supported by the lens means, for detecting the position of the sun, said detecting means being connected to the drive means to control the driving of the drive means, in accordance with the position of the sun.

2. An apparatus according to claim 1, wherein said second supporting means comprises a vertical hollow rotating shaft connected to and driven by the first drive means, said optical fiber means extending in the vertical hollow rotating shaft.

3. An apparatus according to claim 1, wherein said lens means comprises a single Fresnel lens.

4. An apparatus according to claim 1, wherein the detecting means comprises two pairs of photosensors, each pair having two photosensors, said photosensors issuing detecting signals only when they receive direct sunbeams.

5. An apparatus according to claim 6, further comprising control means which includes means for comparing the outputs of the photosensors and for giving signals to the drive means to selectively drive the latter in accordance with the signals, said means mounted inside said container and operatively connected to said photosensors and said drive means.

6. An apparatus according to claim 5, further comprising an additional detecting photosensor which continuously receives sunbeams from sunrise until sunset, said additional sensor being mounted above the lens means.

7. An apparatus according to claim 6, wherein said control means comprises a divider for dividing the difference between the outputs of the two pairs of photosensors by the output of the additional photosensor.

8. An apparatus according to claim 1, wherein said horizontal axis and the vertical axis intersect with each other at a center of the container.

9. An apparatus according to claim 1, wherein said first supporting means includes a first gimbal ring which supports the lens means, and a second gimbal ring which rotatably supports the first gimbal ring about a first horizontal axis, and said second supporting means includes a third support which rotatably supports the second gimbal ring about a second horizontal axis perpendicular to the first horizontal axis in the same plane.

10. An apparatus according to claim 9, wherein said solar cell means comprises a ring solar cell located on the first gimbal ring.

11. An apparatus according to claim 9, wherein said solar cell means comprises a ring solar cell located on the second gimbal ring.

12. An apparatus according to claim 9, wherein said detecting means comprises two pairs of diametrically opposed photosensors located on the first gimbal ring the photosensors being positioned substantially 90 degrees of arc from each other around said first gimbal ring.

13. An apparatus for collecting and concentrating solar light energy comprising; a transparent container; lens means for collecting and concentrating solar light energy; said lens means including at least two lenses, each said lens having a focus; first supporting means for supporting the lens means so as to rotate the lens means about a horizontal axis; second supporting means for supporting the first supporting means so as to rotate the latter about a vertical axis; optical fiber means located at the respective focuses of said lenses of the lens means and extending to the outside of the container to transmit the collected sunbeams to the outside of the container; first drive means for rotating the lens means about the vertical axis; second drive means for rotating the lens means about a horizontal axis, independently of the drive of the first drive means; solar cell means connected to the first and second drive means to drive the same; and, means movable with and supported by the lens means, for detecting the position of the sun, said detecting means being connected to the drive means to control the driving of the drive means, in accordance with the position of the sun.

14. An apparatus according to claim 13, wherein said small diameter lenses are regular hexagons so that they are arranged in a honeycomb pattern.

15. An apparatus to any one of the preceding claims, wherein said container further includes buoy means for causing the apparatus to float on the sea, said buoy means including a buoy.

* * * * *

UNITED STATES PATENT AND TRADEMARK OFFICE
CERTIFICATE OF CORRECTION

PATENT NO. : 4,447,718
DATED : May 8, 1984
INVENTOR(S) : Kei Mori

It is certified that error appears in the above—identified patent and that said Letters Patent is hereby corrected as shown below:

Column 1, line 17, "inveniton" should be --invention--.

Column 1, line 23, "morevoer" should be --moreover--.

Column 1, line 28, "surfce" should be --surface--.

Column 1, line 31, "plats" should be --plants--.

Column 2, line 17, "exmaple" should be --example--.

Column 2, lines 44-45, "sunbean" should be --sunbeam--.

Column 2, lines 63-64, "respectivley" should be --respectively--.

Column 3, line 10, "suported" should be --supported--.

Column 8, line 23, after "apparatus" insert --according--.

Signed and Sealed this

Sixteenth Day of October 1984

[SEAL]

Attest:

GERALD J. MOSSINGHOFF

Attesting Officer

Commissioner of Patents and Trademarks